US010009552B2

United States Patent
Velichko et al.

(10) Patent No.: US 10,009,552 B2
(45) Date of Patent: Jun. 26, 2018

(54) IMAGING SYSTEMS WITH FRONT SIDE ILLUMINATED NEAR INFRARED IMAGING PIXELS

(71) Applicant: Semiconductor Components Industries, LLC, Phoenix, AZ (US)

(72) Inventors: Sergey Velichko, Boise, ID (US); Gennadiy Agranov, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 1066 days.

(21) Appl. No.: 13/954,823

(22) Filed: Jul. 30, 2013

(65) Prior Publication Data

US 2014/0078310 A1 Mar. 20, 2014

Related U.S. Application Data

(60) Provisional application No. 61/703,680, filed on Sep. 20, 2012.

(51) Int. Cl.
*H01L 21/70* (2006.01)
*H04N 5/33* (2006.01)
*H01L 27/146* (2006.01)

(52) U.S. Cl.
CPC .......... *H04N 5/33* (2013.01); *H01L 27/1463* (2013.01); *H01L 27/14643* (2013.01)

(58) Field of Classification Search
CPC ........................................ H01L 21/70
See application file for complete search history.

(56) References Cited

U.S. PATENT DOCUMENTS

| | | | |
|---|---|---|---|
| 8,018,016 B2 | 9/2011 | Doan et al. | |
| 8,338,200 B2 | 12/2012 | Forrai et al. | |
| 2006/0219867 A1* | 10/2006 | Yamaguchi | H01L 27/14689 250/208.1 |
| 2010/0144084 A1* | 6/2010 | Doan | G02B 6/12004 438/72 |
| 2010/0148289 A1* | 6/2010 | McCarten | H01L 27/1463 257/432 |
| 2011/0266645 A1* | 11/2011 | Chao | H01L 27/14603 257/432 |
| 2013/0062593 A1 | 3/2013 | Jones et al. | |
| 2014/0077323 A1* | 3/2014 | Velichko | H01L 27/14627 257/432 |

* cited by examiner

*Primary Examiner* — Marvin Payen
(74) *Attorney, Agent, or Firm* — Treyz Law Group, P.C.; Zachary D. Hadd

(57) ABSTRACT

An imaging system may include an image sensor having front side illuminated near infrared image sensor pixels. Each pixel may be formed in a graded epitaxial substrate layer such as a graded p-type epitaxial layer or a graded n-type epitaxial layer on a graded p-type epitaxial layer. Each pixel may be separated from an adjacent pixel by an isolation trench formed in the graded epitaxial layer. A deep p-well may be formed within each isolation trench. The isolation trenches and photodiodes for the pixels may be formed in the graded p-type epitaxial layer or the graded n-type epitaxial layer. The graded p-type epitaxial layer may have an increasing concentration of dopants that increases toward the backside of the image sensor. The graded n-type epitaxial layer may have an increasing concentration of dopants that increases toward the front side of the image sensor.

20 Claims, 5 Drawing Sheets

IMAGING SYSTEMS WITH FRONT SIDE ILLUMINATED NEAR INFRARED IMAGING PIXELS

This application claims the benefit of provisional patent application No. 61/703,680, filed Sep. 20, 2012, which is hereby incorporated by reference herein in its entirety.

BACKGROUND

This relates generally to imaging systems, and more particularly, to imaging systems with front side illuminated near infrared image pixels.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

In some situations, it is desirable to capture images using infrared light in addition to, or separately from, images captured using visible light. However, typical image pixels that are formed in a silicon substrate can have limited infrared imaging capability due to the relatively low absorption of near-infrared (NIR) light in silicon. Additionally, NIR photons penetrate deeper into a silicon substrate and can generate pixel crosstalk which results in lower image sharpness in existing sensors in response to NIR light.

It would therefore be desirable to be able to provide improved imaging systems for capturing infrared images.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

An image sensor may include imaging pixels configured to respond to various colors of light. As examples, an image sensor may include red image pixels, blue image pixels, clear image pixels, green image pixels, yellow image pixels, and/or infrared image pixels such as near infrared image pixels. Near infrared image pixels may include an infrared color filter element that blocks or absorbs visible light while passing near infrared light onto photosensitive regions of the near infrared pixel. The image pixels in the image sensor may be front side illuminated (FSI) image pixels.

Figure 1:
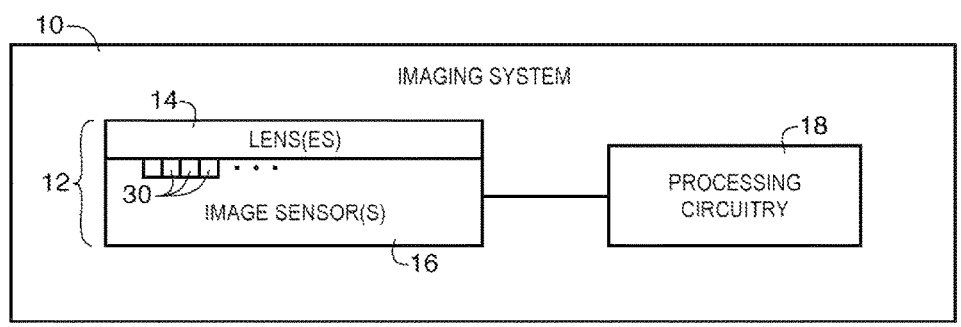
FIG. 1 is a diagram of an illustrative imaging system that may include a camera module having an image sensor with front side illuminated infrared image pixels in accordance with an embodiment of the present invention.

FIG. 1 is a diagram of an illustrative imaging system that uses an image sensor having front side illuminated near infrared image pixels to capture images. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor integrated circuit die with an array of image pixels 30. Image pixels 30 may include one or more front side illuminated (FSI) infrared image sensor pixels (sometimes referred to herein as front side illuminated near infrared image pixels, front side illuminated image pixels, image pixels, or pixels). Image sensor 16 may include one or more arrays of image pixels 30 such as red image pixels, blue image pixels, clear image pixels, green image pixels, yellow image pixels, and/or near infrared image pixels.

During image capture operations, light from a scene may be focused onto an image pixel array on image sensor 16 by lens 14. Image sensor 16 provides corresponding digital image data to control circuitry such as processing circuitry 18.

Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Figure 2:
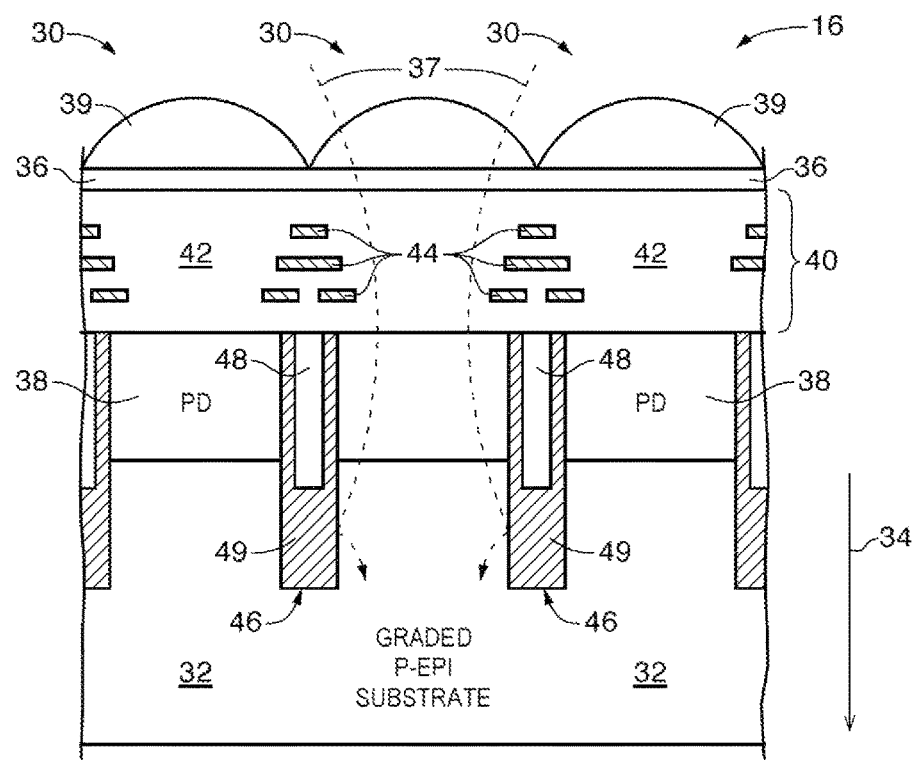
FIG. 2 is a cross-sectional side view of illustrative front side illuminated infrared image pixels that are formed in a graded p-type epitaxial substrate in accordance with an embodiment of the present invention.

FIG. 2 is a cross-sectional side view of a portion of image sensor 16 that includes front side illumination infrared image sensor pixels 30. As shown in FIG. 2, each image pixel 30 may include a photosensitive element such as photodiodes 38 formed in a substrate such as substrate layer 32 (e.g., an active p-type epitaxial substrate). Substrate layer 32 may be a graded p-type epitaxial layer (sometimes referred to herein as a graded p-epi substrate) in which the concentration of p-type dopants increases toward the backside of sensor 16 in the direction of arrow 34.

In order to provide effective NIR photon generated charge collection and transfer of the generated charges to the surface of photodiodes (PDs) 38 and effective suppression of optical and electrical pixel crosstalk, graded p-epi substrate 32 may include deep trench pixel isolation using trenches 48 between pixels and additional deep implantation of p-wells 49 through trenches 48.

Each pixel 30 may include a photodiode 38 formed in substrate 32, a color filter element 36 and a microlens 39. Each microlens 39 may focus image light such as NIR light 37 through an associated color filter element 36 and onto the photodiode 38 of that pixel. Optical and electrical crosstalk may be prevented by pixel isolation structures such as pixel isolation structures 46 that separate the photodiodes of adjacent pixels.

Each pixel isolation structure 46 may be formed from a deep trench 48 in substrate 32 and deep p-well 49 formed through that trench. Formation of p-wells 49 may also form a passivation layer on the interior surfaces of trenches 48. Each trench 48 may be filled with a material such as silicon oxide. Trenches 48 may be formed in a very deep trench isolation (VDTI) process. The VDTI process may be followed by a very deep p-well implantation process via the deep trench that effectively isolates photodiodes 38 and pixels 30 from each other. Additionally, VDTI trenches 48 may provide optical isolation between adjacent pixels 30 to the depth of VDTI trenches 48. VDTI trenches may be completely filled with material such as silicon oxide or, if desired, some air may be left in the VDTI trench between sidewalls of the trench to further optically isolate pixels 30 from each other.

As shown in FIG. 2, dielectric stack 40 may be formed on the front surface of substrate 32. Dielectric stack 40 may be interposed between photodiodes 38 and microlenses 39 so that light such as light 37 is focused through dielectric stack 40 onto photodiodes 38 by microlenses 39. Dielectric stack 40 may have alternating layers of metal 44 and dielectric material 42. Metal interconnects 44 may be patterned metal layers within in dielectric stack 40. Metal interconnects 44 may be formed from a suitable metal such as copper or aluminum. Dielectric stack 40 may include metal vias. Dielectric stack may have, for example, two or more metal layers, four or more metal layers, six or more metal layers, or other suitable numbers of metal layers. Dielectric stack 40 may also be known as interlayer dielectric (ILD). Metal layer and via layers may be known as interconnect layers.

In a configuration of the type shown in FIG. 2, photodiodes 38 may include a p-n junction at a depth of between 3 microns and 4 microns (for example) from the front side of substrate 32. However, this configuration is merely illustrative. If desired, the depth of the p-n junction and the resulting NIR imaging efficiency may be further increased using a substrate having a combination of graded p-type epitaxial (p-epi) and graded n-type epitaxial (n-epi) layers. This type of configuration is shown in FIG. 3.

Figure 3:
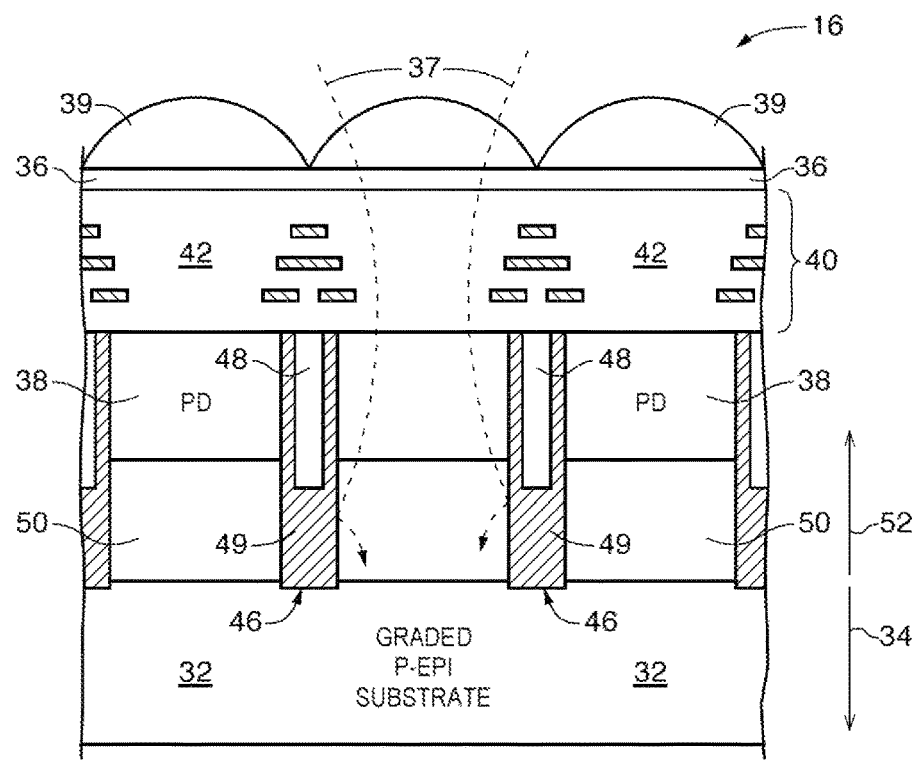
FIG. 3 is a cross-sectional side view of an illustrative front side illuminated infrared image pixels that are formed in a combined graded n-type and graded p-type epitaxial substrate in accordance with an embodiment of the present invention.

As shown in FIG. 3, an n-type epitaxial substrate layer such as graded n-epi layer 50 may be formed on graded p-epi layer 32 so that n-epi layer 50 is interposed between p-epi layer 32 and dielectric stack 40. Photodiodes 38 may be formed in n-epi layer 50. The concentration of p-epi carriers may increase toward the backside of image sensor 16 in the direction of arrow 34 and the concentration of n-epi carriers may increase toward the frontside of image sensor 16 in the direction of arrow 52.

In this way, image sensor 16 may be configured so that the p-epi carrier concentration in substrate 32 is highest at the bottom, less in the middle, and completely eliminated in n-epi portion 50 and the n-epi substrate 50 has a concentration of n-type carriers that increases in the direction of the silicon surface. Additional implantation of PDs 38 with the highest n-type concentration creates vertical electrical fields in the image sensor, thereby effectively pulling photon generated electrons to the silicon surface for easy transfer of the charge within the pixel. This arrangement allows formation of a p-n junction down to between 8 microns to 10 microns in depth (for example) using existing implantation tool capabilities. This type of arrangement may extend NIR photon absorption in the substrate to a depth of up to 12 microns to 16 microns with improved pixel crosstalk control.

The configurations described above in which photon-generated electrons accumulate in photodiodes formed in graded n-epi and p-epi substrates with deep trench and deep p-well isolation between the photodiodes are merely illustrative. If desired, pixels 30 may collect photon-generated holes in photodiodes formed in graded p-epi substrates in which the concentration of p-type dopants increases toward the surface of the silicon and in which deep trench and deep n-well isolation structures are formed between the photodiodes. In another example, hole collecting photodiodes with very deep p-n junctions may be formed in a graded p-epi substrate that is formed on a top of a graded n-epi substrate in which the concentration of p-type dopants in the p-epi substrate increases toward the surface of the silicon and the concentration of n-type dopants in the graded n-epi substrate increases toward the backside of the silicon and in which deep trench and deep n-well isolation structures between the photodiodes extend up to or beyond the interface between the graded p-epi and the n-epi substrates.

Figure 4:
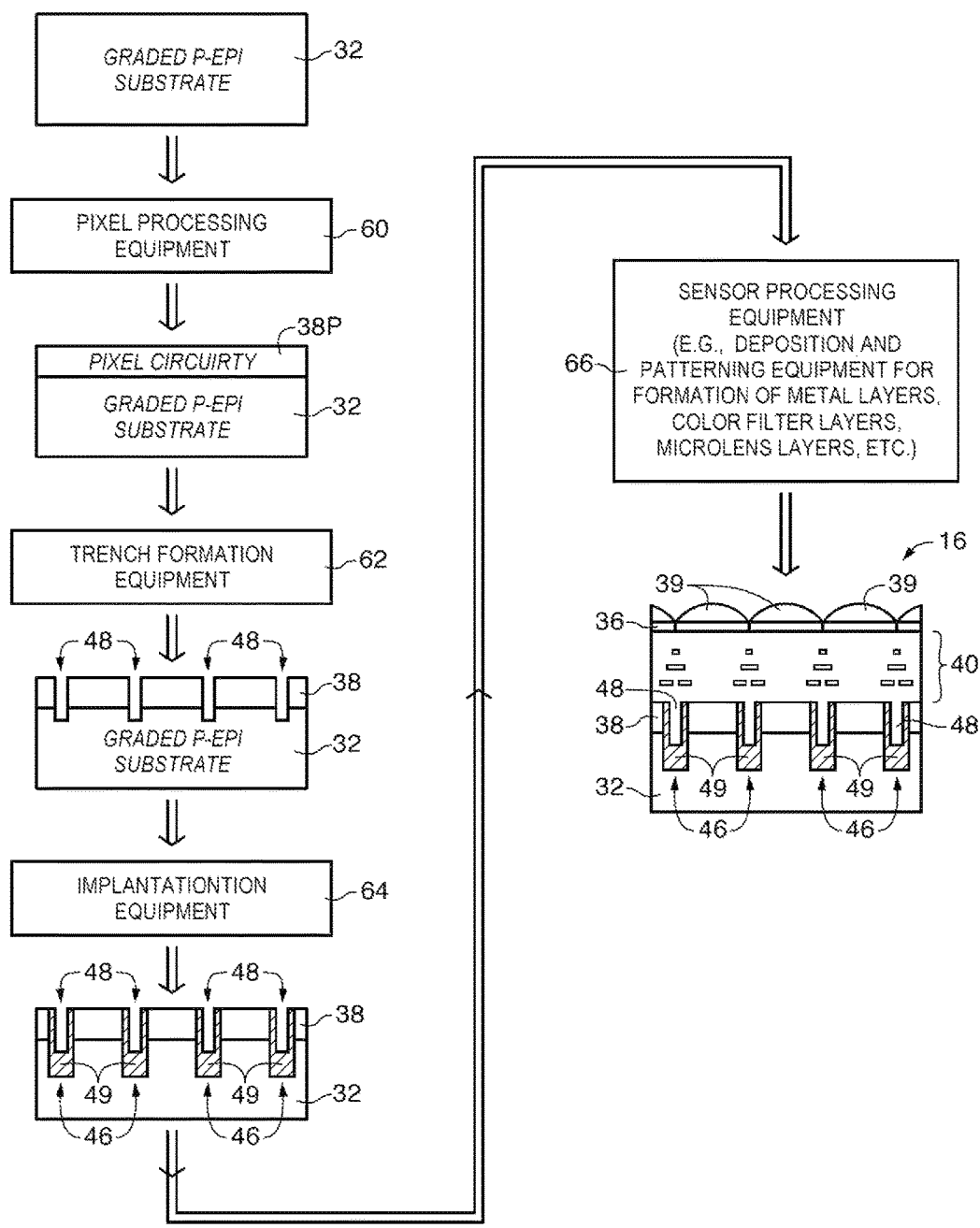
FIG. 4 is a flow diagram showing illustrative steps involved in forming front side illuminated infrared image pixels in a graded p-type epitaxial substrate in accordance with an embodiment of the present invention.

FIG. 4 is a flow diagram showing illustrative steps that may be used in the formation of an image sensor of the type shown in FIG. 2. As shown in FIG. 4 a substrate such as a silicon substrate having at least a portion with a graded p-epi layer 32 may be provided to pixel processing equipment 60. Pixel processing equipment 60 (e.g., deposition equipment, patterning equipment, implantation equipment, annealing equipment, or other suitable equipment for forming pixel components such as photodiodes and transistors in a silicon substrate) may be used to form pixel circuitry 38P (e.g., a blanket photodiode) in substrate 32. Blanket photodiode 38P may be formed in part by forming a p-n junction in substrate 32 by implanting a high concentration of n-type dopants as deep as possible in substrate 32.

Trench formation equipment 62 (e.g., masking equipment, etching equipment, etc.) may be used to perform very deep trench isolation (VDTI) operations to form trenches 48 in substrate 32 in which blanket photodiode 38P has been formed, thereby isolating photodiodes 38 of each individual pixel.

Without filling trenches 48, implantation equipment 64 may be used to implant very deep p-wells 49 in trenches 48. Deep p-well implantation operations may also passivate the sidewalls of trenches 48.

Sensor processing equipment 66 (e.g., deposition and patterning equipment, equipment for formation of metal layers, color filter layers, and microlens layers, trench filling equipment, etc.) may be used to fill trenches 48 with a filler material such as an oxide material (e.g., by filling trenches 48 with an oxide material such as silicon oxide in the presence of hydrogen and deuterium), to form pixel gates and dielectric stack 40 over photodiodes 38, and to form color filter elements 36 and/or microlenses 39 on dielectric stack 40 to form image sensor 16.

Figure 5:
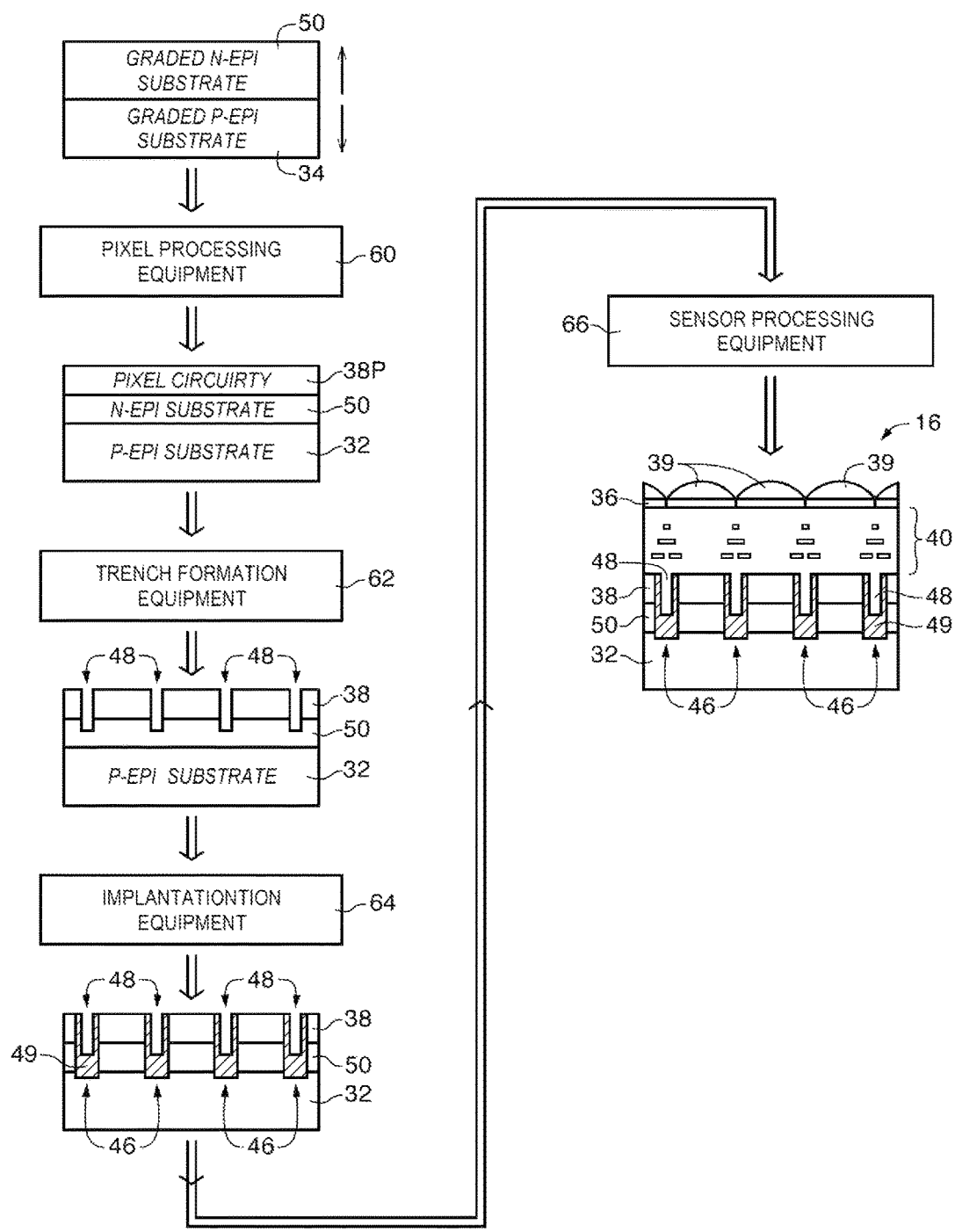
FIG. 5 is a flow diagram showing illustrative steps involved in forming front side illuminated infrared image pixels in a combined graded n-type and graded p-type epitaxial substrate in accordance with an embodiment of the present invention.

FIG. 5 is a flow diagram showing illustrative steps that may be used in the formation of an image sensor of the type shown in FIG. 3. As shown in FIG. 5 a substrate such as a silicon substrate having at least a portion with a graded p-epi layer 32 and a graded n-epi layer 50 may be provided to pixel processing equipment 60. Pixel processing equipment may be used to form pixel circuitry 38P (e.g., a blanket photodiode) in graded n-epi substrate layer 50. Blanket photodiode 38P may be formed in part by implanting a high concentration of n-type dopants as deep as possible in graded n-epi substrate layer 50.

Trench formation equipment 62 (e.g., masking equipment, etching equipment, etc.) may be used to perform very deep trench isolation (VDTI) operations to form trenches 48 in substrate layer 50 in which blanket photodiode 38P has been formed, thereby isolating photodiodes 38 of each individual pixel.

Without filling trenches 48, implantation equipment 64 may be used to implant very deep p-wells 49 in trenches 48 in layer 50. Deep p-well implantation operations may also passivate the sidewalls of trenches 48. P-wells 49 may extend to the interface between p-epi layer 32 and n-epi layer 50 or my extend partially into p-epi layer 32 from n-epi layer 50.

Sensor processing equipment 66 may be used to fill trenches 48 with a filler material such as an oxide material (e.g., by filling trenches 48 with an oxide material such as silicon oxide in the presence of hydrogen and deuterium), to form pixel gates and dielectric stack 40 over photodiodes 38 in layer 50, and to form color filter elements 36 and/or microlenses 39 on dielectric stack 40 to form image sensor 16.

Figure 6:
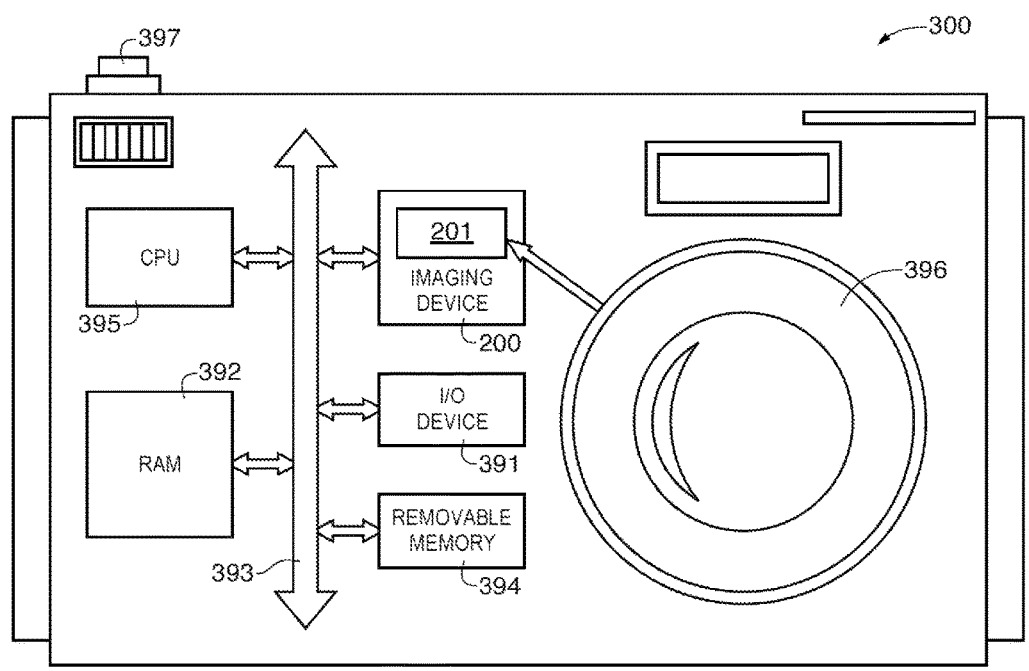
FIG. 6 is a block diagram of an imager employing the embodiments of FIGS. 1-5 in accordance with an embodiment of the present invention.

FIG. 6 shows in simplified form a typical processor system 300, such as a digital camera, which includes an imaging device 200. Imaging device 200 may include a pixel array 201 (e.g., an array of image sensor pixels such as front side illuminated near infrared pixels 30 of FIG. 2 or FIG. 3). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having image sensors with arrays of front side illuminated (FSI) near infrared image sensor pixels. Each FSI near infrared image sensor pixel may be formed in a graded epitaxial substrate layer such as a graded p-type epitaxial substrate layer or a combined graded n-type epitaxial substrate layer on a graded p-type epitaxial substrate layer. Each front side illuminated near infrared pixel may be separated from an adjacent front side illuminated near infrared pixel by a deep isolation trench formed in the graded epitaxial substrate layer. A deep p-well may be formed within each isolation trench (e.g., at the bottom of the trench).

The isolation trenches and photodiodes for the pixels may be formed in the graded p-epi (graded p-type epitaxial) layer or the n-epi (graded n-type epitaxial) layer. The graded p-epi layer may have an increasing concentration of p-type carriers that increases toward the backside of the image sensor. The graded n-epi layer may have an increasing concentration of n-type carriers that increases toward the front side of the image sensor.

The deep p-well in each trench may be formed by forming the trench in the graded epitaxial substrate layer using very deep trench isolation techniques and, before filling the trenches, implanting p-type dopants into each trench using deep p-well implantation techniques.

The foregoing is merely illustrative of the principles of this invention which can be practiced in other embodiments.

What is claimed is:

1. An image sensor, comprising:
   a graded p-type epitaxial substrate layer;
   a plurality of front side illuminated image sensor pixels formed in the graded p-type epitaxial substrate layer; and
   a plurality of isolation trenches in the graded p-type epitaxial substrate layer that separate adjacent front side illuminated image sensor pixels.

2. The image sensor defined in claim 1, further comprising:
   a deep p-well formed in each of the plurality of isolation trenches.

3. The image sensor defined in claim 2, further comprising:
   a passivation layer on sidewall surfaces of each of the plurality of isolation trenches.

4. The image sensor defined in claim 2, further comprising:
   a dielectric stack formed on the graded p-type epitaxial substrate layer.

5. The image sensor defined in claim 4 wherein the dielectric stack comprises metal interconnects in a dielectric material.

6. The image sensor defined in claim 5 wherein each front side illuminated image sensor pixel includes a microlens.

7. The image sensor defined in claim 6 wherein each front side illuminated image sensor pixel includes a photodiode formed in the graded p-type epitaxial substrate layer.

8. The image sensor defined in claim 7 wherein the dielectric stack is interposed between the photodiodes and the microlenses of the front side illuminated image sensor pixels.

9. An image sensor, comprising:
   a graded p-type epitaxial substrate layer; a graded n-type epitaxial substrate layer on the graded p-type epitaxial substrate layer;
   a plurality of front side photodiodes formed in the graded n-type epitaxial substrate layer; and a plurality of isolation trenches in the graded n-type epitaxial substrate layer that separate adjacent photodiodes.

10. The image sensor defined in claim 9, further comprising:
a deep p-well formed in each of the plurality of isolation trenches that extends from the graded n-type epitaxial substrate layer at least to the graded p-type epitaxial substrate layer.

11. The image sensor defined in claim 10, further comprising:
oxide material in each of the plurality of isolation trenches.

12. The image sensor defined in claim 11, further comprising:
a dielectric stack on the graded n-type epitaxial substrate layer.

13. The image sensor defined in claim 12 wherein the graded n-type epitaxial substrate layer is interposed between the dielectric stack and the graded p-type epitaxial substrate layer.

14. The image sensor defined in claim 13, further comprising:
a plurality of microlenses, wherein each of the plurality of microlenses is configured to focus light onto an associated one of the plurality of photodiodes through the dielectric stack.

15. The image sensor defined in claim 14 wherein the dielectric stack in interposed between the plurality of microlenses and the plurality of photodiodes.

16. The image sensor defined in claim 15, further comprising:
a plurality of color filter elements, wherein each of the plurality of microlenses is configured to focus light onto the associated one of the plurality of photodiodes through an associated one of the color filter elements and through the dielectric stack.

17. A system, comprising:
a central processing unit;
memory;
input-output circuitry; and
an imaging device, wherein the imaging device comprises:
a graded epitaxial substrate layer, wherein the graded epitaxial substrate layer comprises a dopant; and
an array of front side illuminated near infrared pixels in the graded epitaxial substrate layer, wherein each front side illuminated near infrared pixel is separated from an adjacent front side illuminated near infrared pixel by a deep isolation trench formed in the graded epitaxial substrate layer, wherein each of the front side illuminated near infrared pixels comprises a front side through which light is received and a back side opposite the front side, and wherein the concentration of the dopant in the graded epitaxial substrate layer increases towards the back side of each of the front side illuminated near infrared pixels.

18. The system defined in claim 17 wherein the imaging device further comprises a deep p-well in each deep isolation trench.

19. The system defined in claim 18 wherein the dopant comprises a p-type dopant and the graded epitaxial substrate layer comprises a graded p-type epitaxial layer.

20. The system defined in claim 19 further comprising:
an additional dopant, wherein the additional dopant comprises an n-type dopant; and
an additional graded epitaxial substrate layer, wherein the additional graded epitaxial substrate layer comprises a graded n-type epitaxial layer that is doped with the n-type dopant.

\* \* \* \* \*